United States Patent
Sasaki et al.

[19]

[11] Patent Number: 6,152,819
[45] Date of Patent: Nov. 28, 2000

[54] NUMERICAL CONTROL DEVICE

[75] Inventors: Kazuyuki Sasaki, Higashiyatsushiro-gun; Kazuhiko Hirano, Minamitsuru-gun, both of Japan

[73] Assignee: Fanuc Ltd., Yamanashi, Japan

[21] Appl. No.: 09/288,697

[22] Filed: Apr. 9, 1999

[30] Foreign Application Priority Data

Apr. 10, 1998 [JP] Japan .................................. 10-114369

[51] Int. Cl.[7] .................................................. H05K 5/00
[52] U.S. Cl. ........................................... 454/184; 361/695
[58] Field of Search .............................. 454/184; 361/695

[56] References Cited

U.S. PATENT DOCUMENTS

| | | | |
|---|---|---|---|
| 5,142,442 | 8/1992 | Daniels et al. | 361/384 |
| 5,208,730 | 5/1993 | Tracy | 361/384 |
| 5,398,161 | 3/1995 | Roy | 361/727 |
| 5,460,441 | 10/1995 | Hastings et al. | 312/298 |
| 5,680,294 | 10/1997 | Stora et al. | 361/695 |
| 5,680,295 | 10/1997 | Le et al. | 361/695 |
| 5,684,674 | 11/1997 | Yin | 361/695 |
| 5,831,822 | 11/1998 | Hulick et al. | 361/687 |
| 5,927,386 | 7/1999 | Lin . | |
| 6,005,770 | 12/1999 | Schmitt | 361/695 |

FOREIGN PATENT DOCUMENTS

| | | |
|---|---|---|
| 04126000 | 4/1992 | Japan . |
| 08046379 | 2/1996 | Japan . |
| 09199881 | 7/1997 | Japan . |

Primary Examiner—Harold Joyce
Assistant Examiner—Andrea M. Joyce
Attorney, Agent, or Firm—Staas & Halsey LLP

[57] ABSTRACT

A numerical control device comprises a box structure, a board unit housed inside the box structure, a wire distribution board disposed on the rear surface of the box structure, and a fan unit detachably mounted to the top surface of the box structure. The fan unit has a fan motor inside. A first connector wired from a power supply terminal is secured to the box structure while a second connector wired from a fan motor is secured to the fan unit at a position opposite the first connector secured to the box structure. Thus, the second connector can be connected to and removed from the first connector.

8 Claims, 8 Drawing Sheets

NUMERICAL CONTROL DEVICE

BACKGROUND OF THE INVENTION

1. Field of the Invention

The present invention relates to a numerical control device provided with a cooling fan.

2. Description of the Related Art

A numerical control device wherein a board unit (comprised of a plurality of boards) housed inside a box structure is provided with a cooling fan to prevent increases in internal temperature.

This fan motor is mounted to a fan cover. Normally, a fan motor is mounted to a box structure by means of screws to secure the fan cover to the surface of the box structure.

Further, a wire distribution board for connection is disposed on the rear surface of the box structure. This wire distribution board is used in a wiring operation that connects boards or a board unit and a board unit of a separate numerical control device. Normally, for the power supply of the fan motor, a lead wire is used to connect the power supply terminals of the wire distribution board and the terminals on the fan motor side together.

According to this method however, there are not only many wiring operations on-site leading to tedious work but also making cases in which the work space is narrow making manual wiring difficult. Because of this, the operability during assembly and maintenance inspections is poor.

OBJECTS AND SUMMARY OF THE INVENTION

The objects of the present invention are to provide a numerical control device that incorporates a fan unit in a box structure while simultaneously allowing a connection between a first connector wired from a power supply terminal and a second connector wired from a fan motor as well as simplifying assembly and maintenance operations.

In order to achieve these objects, a numerical control device comprises a box structure, boards housed inside the box structure, and a fan unit which has a fan motor therein and is detachably mounted to the box structure, characterized in that a first connector wired from a power supply terminal or directly mounted on the wire distribution board is secured to the box structure or the wire distribution board and a second connector wired from a fan motor is atached to the fan motor at a position opposing the first connector secured to the box structure or the wire distribution board.

According to the present invention, because the fan unit is incorporated in the box structure while simultaneously allowing a connection between the first connector for power supply and the second connector wired from the fan motor, the wiring operations can be handled with little effort thereby improving the efficiency of assembly and maintenance inspections.

Further, because it is not necessary to use a separate securing apparatus such as a screw to couple the wire distribution board and fan unit to the box structure, assembly is simplified and the number of parts is also reduced.

Further, even if the first connector and the second connector are shifted slightly when assembling the box structure and the fan unit, the second connector can move so that the position errors are absorbed.

BRIEF DESCRIPTION OF THE DRAWINGS

The foregoing and other objects and features of the present invention will become apparent from the following description of preferred embodiments of the present invention with respect to the accompanying drawings, in which.

DETAILED DESCRIPTION OF THE PREFERRED EMBODIMENTS

Figure 1A:
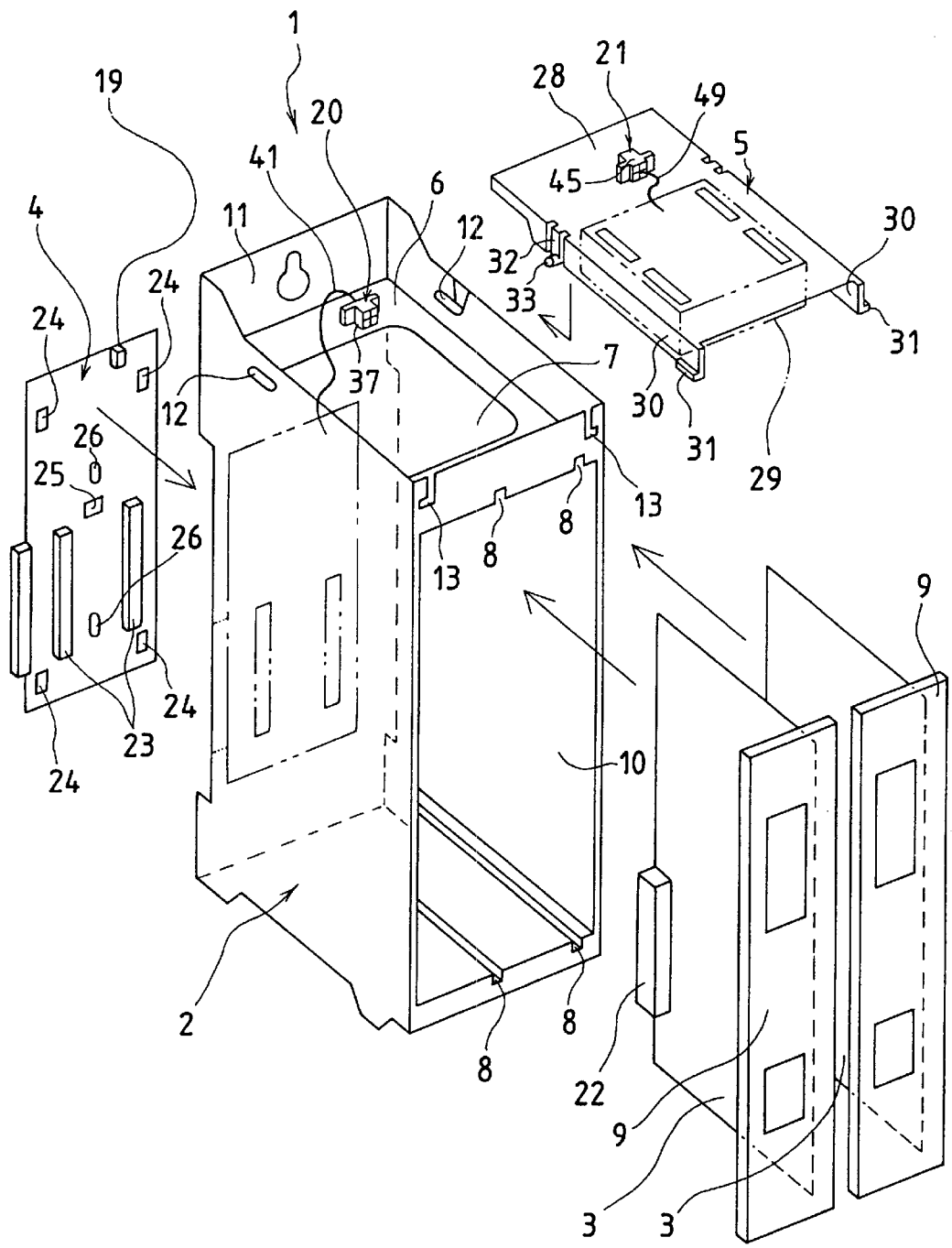
FIG. 1A is a disassembled perspective view of a numerical control device of a first embodiment of the present invention.

A first embodiment is explained with reference to FIGS. 1A, 2 and 3.

A numerical control device 1 of the present invention is comprised by a box structure 2, a board unit comprising a plurality of boards 3 such as a power supply board and control boards, housed within the box structure 2, a wire distribution board 4 for connecting the board unit, disposed on the rear surface of the box structure 2, a fan unit 5 detachably mounted on the top surface of the box structure 2, a first connector 20 secured to the box structure 2, and a second connector 21 mounted to the fan unit 5.

As shown in FIG. 1A, box structure 2 is formed from a plastic formed body with a slight gap open from the upper edge of the structure with a top panel 6 being installed therein. A board accommodation space 10 is formed under the top panel 6 with a front surface that opens. Further, the fan unit accommodation space 11 is formed over the top panel 6 with a top surface that opens and an opening portion 7 is cut out in the top panel 6 so that the board accommodation space 10 and the fan unit accommodation space 11 communicate.

Still further, a plurality of guide channels 8 are formed along the front-to-back direction on the bottom surface and top surface of the board accommodation space 10. By setting the top and bottom edge portions of the board 3 into these guide channels 8, the board 3 is allowed to slide into the board accommodation space 10 from the front surface that opens, making it possible to be supported.

A front portion cover 9 of the plastic formed body is attached to the front edge of the board 3 to cover the front surface of the box structure 2.

Slots 12 are cut out in the side walls which define the fan unit accommodation space 11 at portions near the rear wall to extend in the front-to-back direction, while generally L-shaped notches 13, the tips of which are bent towards the outside, are formed in both the front and rear wall which define the fan unit accommodation space 11 at portions near the side walls.

Figure 1B:
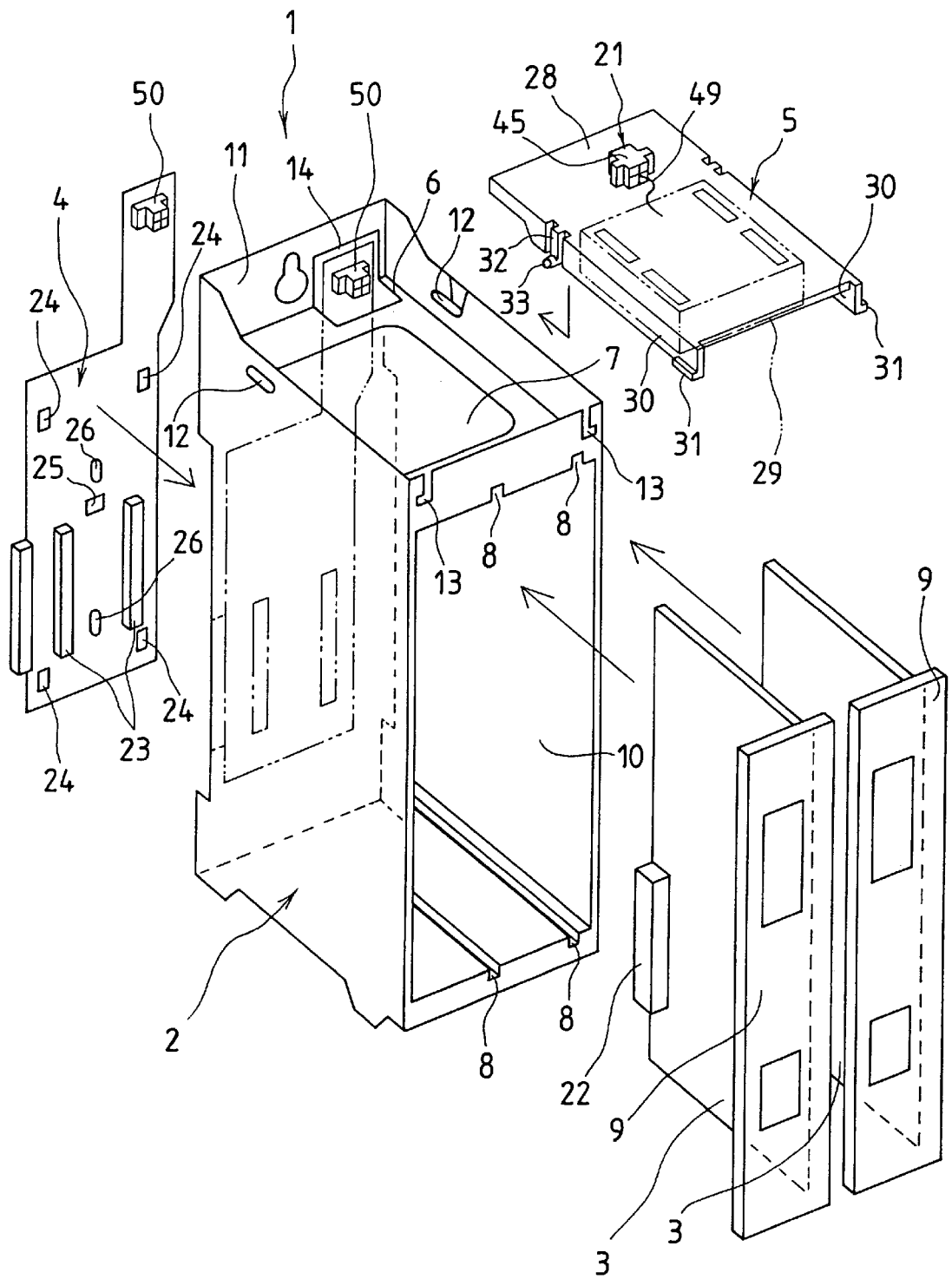
FIG. 1B is a disassembled perspective view of a numerical control device of a second embodiment of the present invention.
Figure 2:
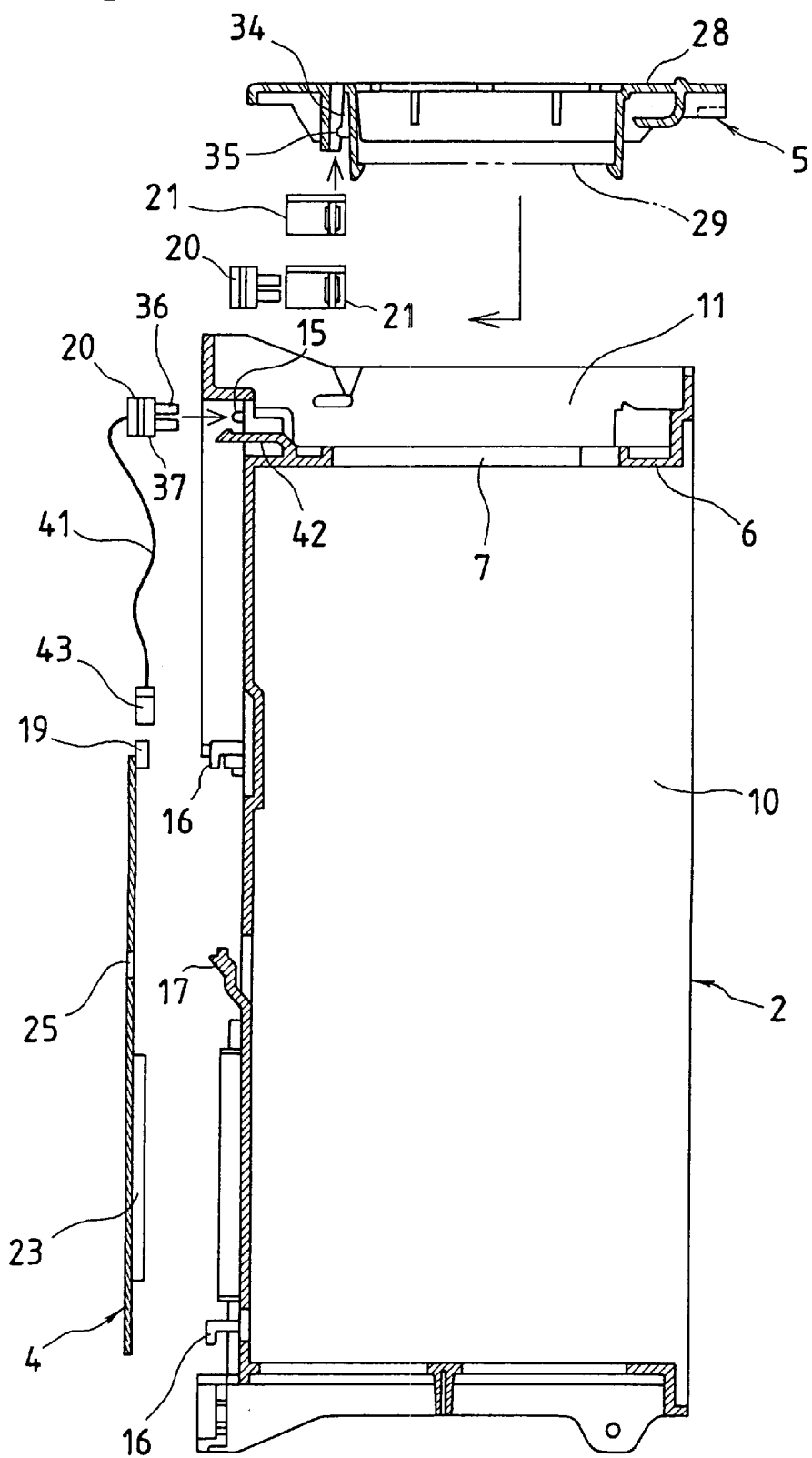
FIG. 2 is a vertical cross section of the numerical control device of FIG. 1A.
Figure 3:
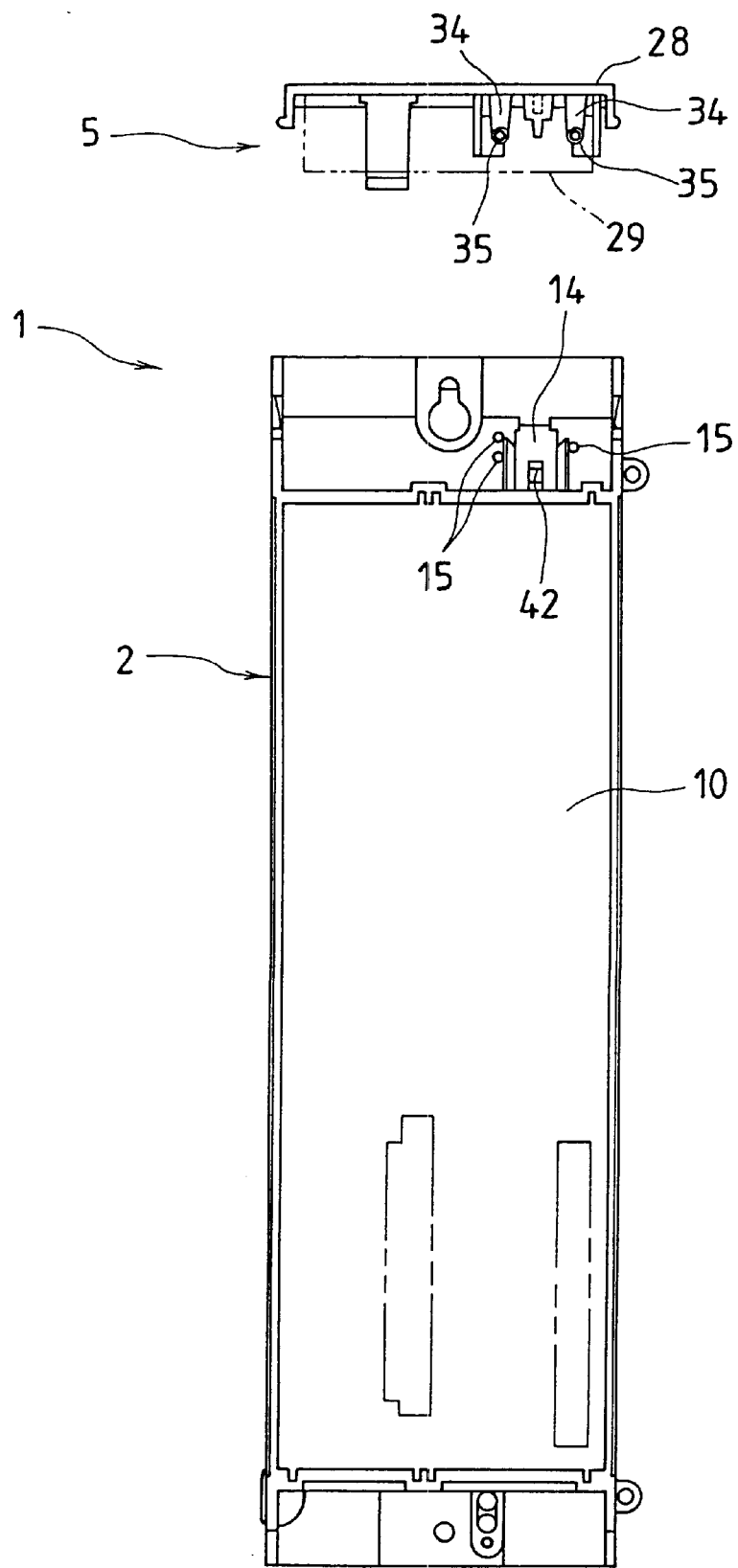
FIG. 3 is a vertical cross section of the numerical control device of FIG. 1A.

Furthermore, as shown in FIGS. 1B, 2 and 3, a window portion 14 for setting a first connector 20 is cut out in the rear wall which defines the fan unit accommodation space 11. A snap coupling arm 42 protrudes towards the rear from a generally central portion of the window portion 14. The snap coupling arm 42 has an elasticity and is formed with a hook on its tip facing upward. Moreover, the connector support protrusions 15 protrude towards the rear from both sides of the window portion 14.

Figure 4:
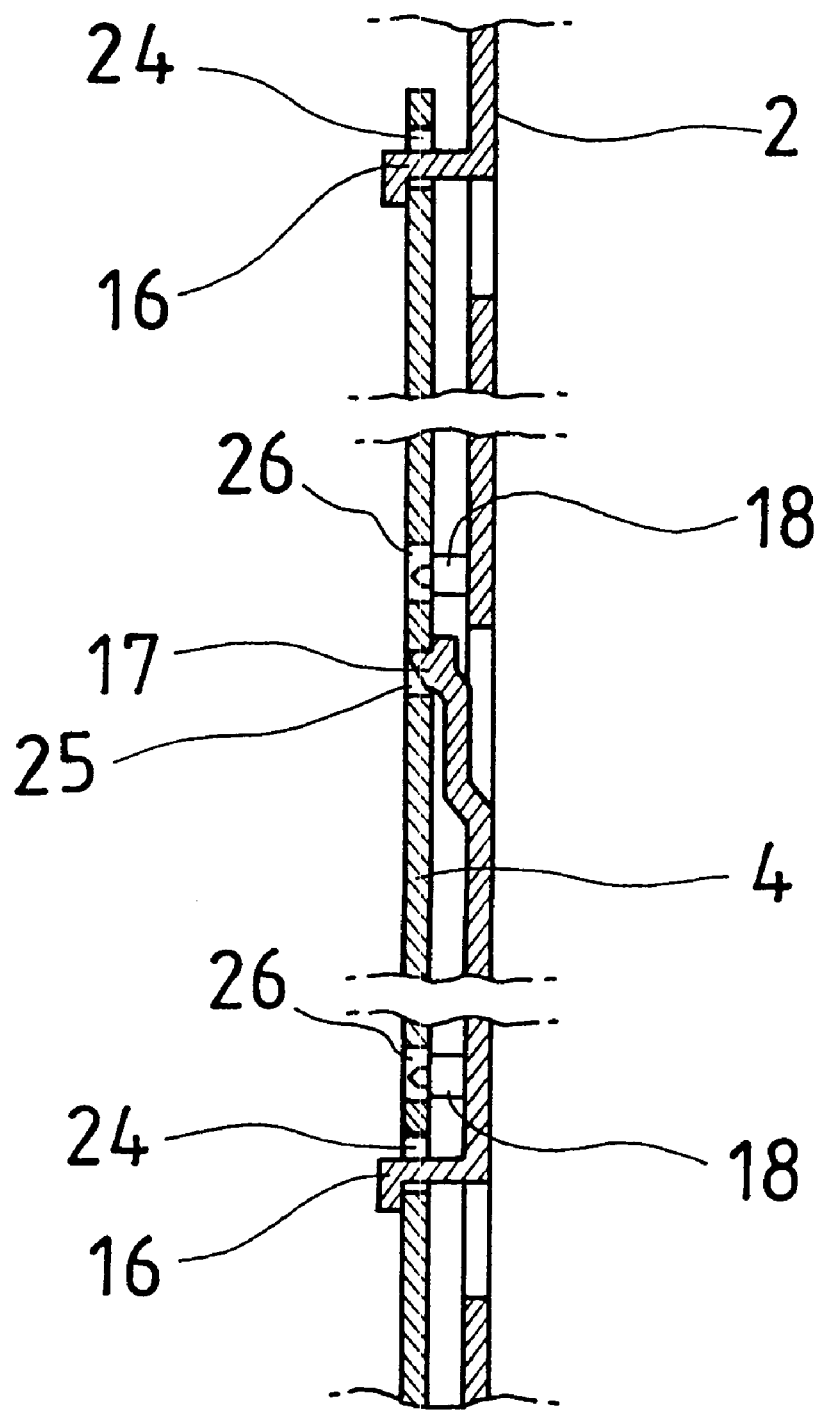
FIG. 4 is a vertical cross section of the coupling portion between the wire distribution board and the box structure.

As shown in FIG. 2 and FIG. 4, portions at four corners of the wall at the rear of the board accommodation space 10 are cut to erect rearward and the tip of each of these cut portions is bent downward to form a hook-shaped piece 16. A holding protrusion 17 protrudes from the center portion of the wall at the rear of the board accommodation space 10. This holding protrusion 17 has a tapered surface leaning towards the rear upward.

Furthermore, a positioning protrusion 18 is attached at a suitable location on the rear surface of the box structure 2.

The wire distribution board 4 functions to connect one board 3 to the other board 3, one board 3 to external devices, or one board unit to the other board units housed in other numerical control devices, and is detachably mounted to the wall at the rear of the board accommodation space 10, as shown in FIG. 1A.

Moreover, as shown in FIG. 1A and FIG. 2, a power supply terminal 19 is disposed on the upper edge of the wire distribution board 4 and terminals 23 are disposed at suitable locations on the front surface of the wire distribution board 4. These terminals 23 are connected to the terminals 22 of each board 3.

Openings 24 are cut out at the four corners of the wire distribution board 4 and hold the hook-shaped pieces 16 of the box structure 2. The positioning hole 26 is cut out at a position corresponding to the positioning protrusion 18. Further, the through hole 25 is cut out at the center portion of the wire distribution board 4. This through hole 25 receives the holding protrusion 17 so that the wire distribution board 4 is fixed to the box structure 2.

In order to mount wire distribution board 4 to the box structure 2, as shown in FIG. 4, the wire distribution board 4 is moved upward and then forward towards the box structure 2, and the hook-shaped pieces 16 and the holding protrusion 17 of the box structure 2 are coupled to the openings 24 and the through hole 25, respectively.

Thereupon, if the wire distribution board 4 presses against the tapered surface of the holding protrusion 17 to cause the holding protrusion 17 to bend forward, then the holding protrusion 17 opposes the through hole 25 and is fitted into the through hole 25 by means of elasticity of the holding protrusion 17.

As shown in FIG. 1A, the fan unit 5 is comprises a cooling fan motor 29 mounted on the lower surface of the fan cover 28.

Both side edge portions of the fan cover 28 are bent downward forming the side walls 30. The projections 31 extend outward from the outer surface of the lower edges at the front portion of these side walls 30. These projections 31 are coupled to the notches 13 of the box structure 2.

Further, portions near to the rear end on both sides of the side walls 30 are cut off at a suitable width so that an elastic arm 32 is formed at each side of the side wall 30. The protruding shafts 33 are formed at the outer surface of the lower edge of the elastic arms 32. The protruding shafts 33 are fitted into slots 12 of the box structure 2 by means of elasticity of the protruding shaft 33. That is, the protruding shaft 33 serves to engage the fan unit 5 with the box structure 2.

Even further, as shown in FIG. 3, a pair of left and right support pieces 34 protrudes downward at the rear portions of the fan cover 28, and the protruding portions 35 are formed at the rear surface of the lower edge of each support piece. These protruding portions 35 are formed at positions which correspond to the connector support protrusions 15 of the box structure 2.

The fan unit 5 is mounted to the box structure in the following manner. The elastic arms 32 are slightly pressed inward and the side walls 30 of the fan unit 5 and the projections 31 are coupled to the notches 13 of the box structure 2. Then, the fan unit 5 is moved rearward from the front surface of the fan unit accommodation space 11.

Thereupon, if the protruding shafts 33 are pressed by the side walls of the box structures 2 so that the elastic arms 32 are bent inward and the protruding shafts 33 reach the slot 12, then the elastic arms 32 will return to their original positions and the protruding shafts 33 and the slots 12 engage with each other by the elasticity of the protruding shafts 33.

Figure 5:
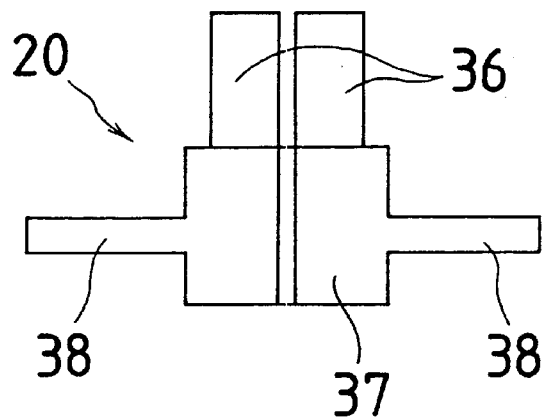
FIG. 5 is a top view of the first connector.
Figure 6:
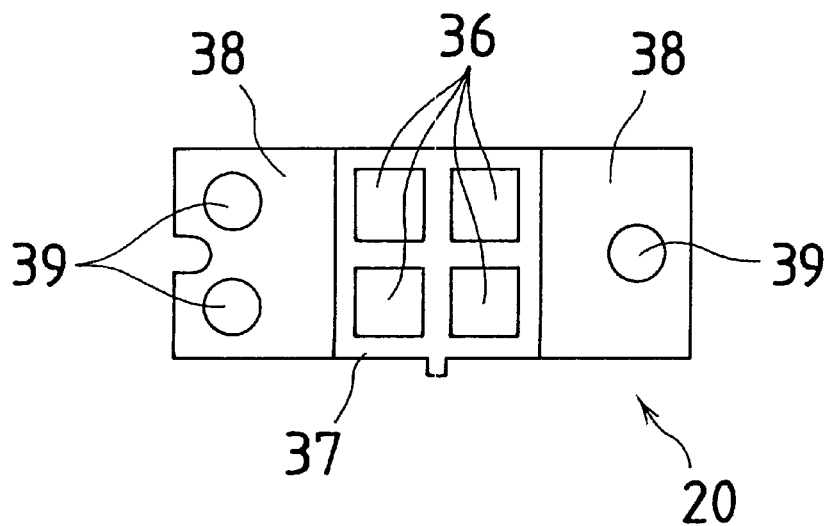
FIG. 6 is a front view of the connector of FIG. 5.
Figure 7:
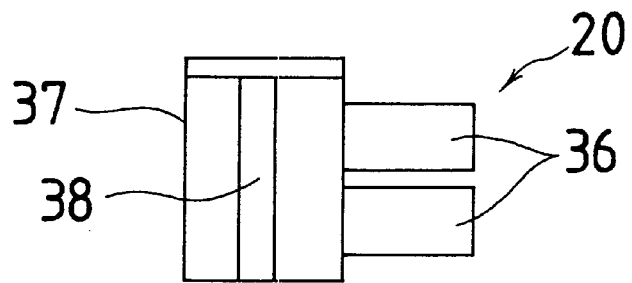
FIG. 7 is a side view of the connector of FIG. 5.

As shown in FIG. 5 to FIG. 7, the first connector 20 is formed with securing pieces 38 protruding from both sides of the connector body 37. The insertion portions 36 which have terminals on their tips are disposed protruding from the front surface of the connector body 37. In addition, securing holes 39 are formed in the securing pieces 38.

Furthermore, a relay cable 41 is drawn out from the connector body 37 and a third connector 43 is mounted to the tip of the relay cable 41. The third connector 43 is connected to the power supply terminal 19 of the wire distribution board 4.

The first connector 20 is secured to the box structure 2 in the following manner. A snap coupling arm 42 is brought into contact with a center portion of the lower surface of the connector body 37 so that the insertion portions 36 of the first connector 20 may face the fan unit accommodation space 11 of the box structure 2. And, the connector body 37 is set in the window portion 14. Next, the connector support protrusions 15 of the box structure 2 are each inserted through the securing holes 39 so as to secure the first connector 20.

Then, the first connector 20, securely mounted to the box structure 2, is electrically connected to the power supply terminal 19 through the relay cable 41.

Figure 8:
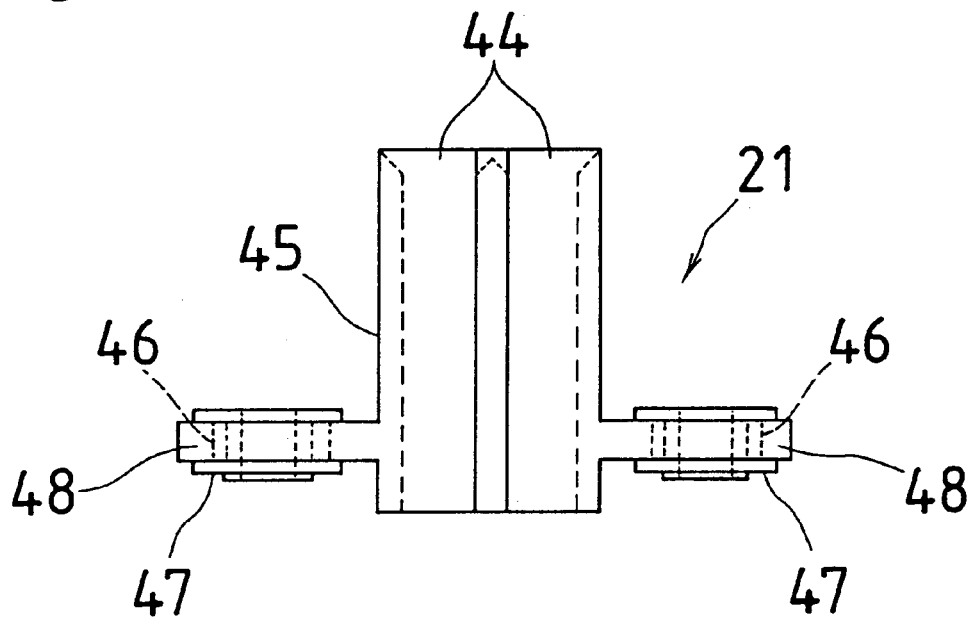
FIG. 8 is a top view of the second connector.
Figure 9:
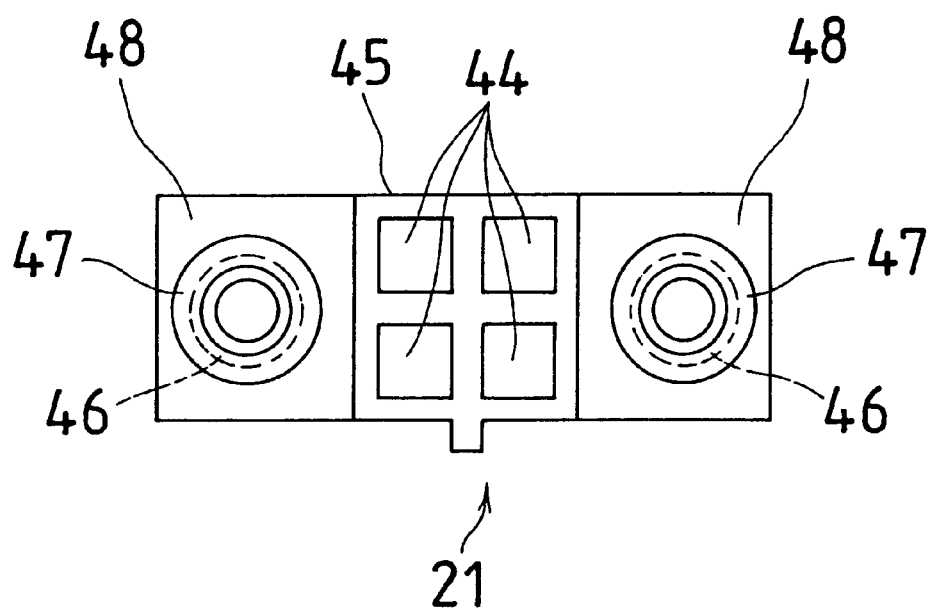
FIG. 9 is a rear view of the second connector.
Figure 10:
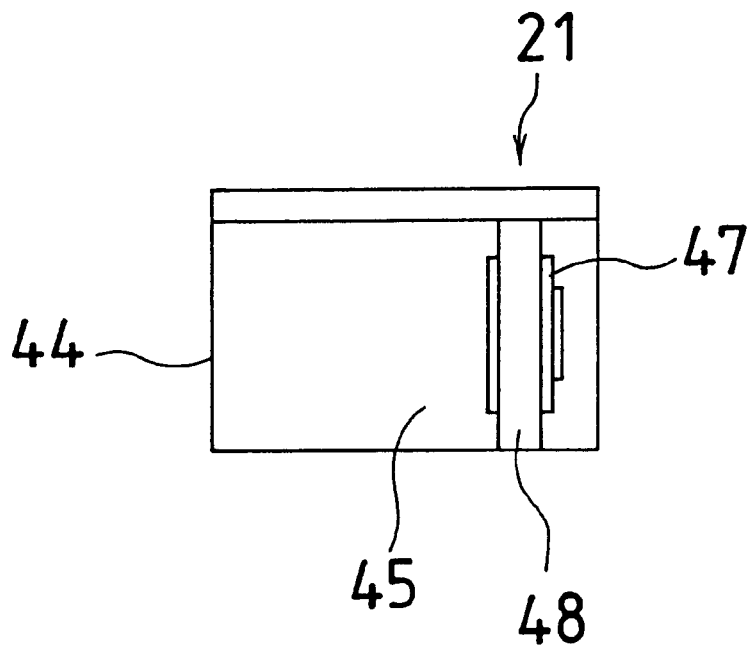
FIG. 10 is a side view of the second connector.

As shown in FIG. 8 to FIG. 10, the second connector 21 comprises of the connector body 45 and securing pieces 48 protruding from both sides of the connector body 45. Receiving portions 44 are disposed on the rear surface of the connector body 45. These receiving portions 44 have terminals at their innermost areas and as shown in FIG. 8, the tips of the inner periphery surfaces of the receiving portions 44 are tapered with the tip direction slanting outwards in order to make it easy to insert insertion portions 36 of the first connector 20.

Figure 11:
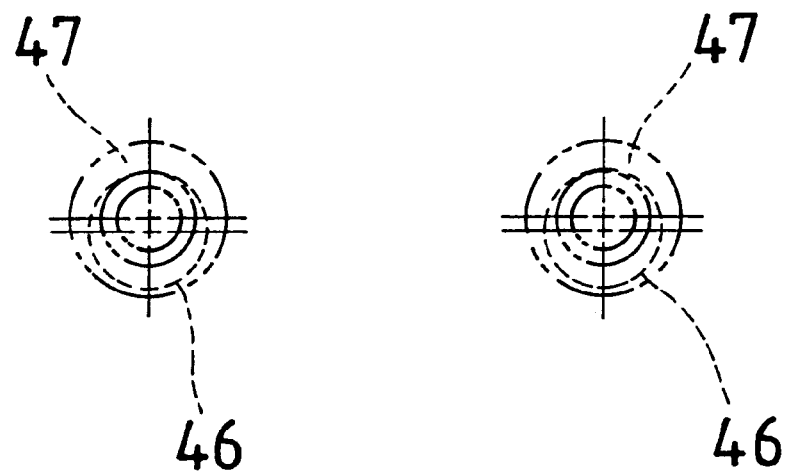
FIG. 11 shows the positional relationship between the mounting hole and bobbin-shaped member when the position of the second connector shifts.

Further, as shown in FIG. 10 and FIG. 11, mounting holes 46 are cut out in the securing pieces 48. The bobbin-shaped members 47 having bore diameters slightly smaller than those of the mounting holes 46 are inserted into the mounting holes 46 so that the sliding movement of the bobbin-shaped member 47 in the axial direction is restricted and further the bobbin-shaped members 47 are movable within a range of the cross-section of the mounting holes 46.

Even further, as shown in FIG. 1A, the connector body 45 of the second connector 21 is electrically connected to the fan motor 29 through the lead wire 49.

Directing the receiving portions 44 towards the rear and inserting the protruding portions 35 which are formed in the fan motor 28 into the center space of the winding shape members 47, the second connector 21 is mounted to the fan unit 5.

Moreover, as described above, when the fan unit 5 is installed in the fan unit accommodation space 11 of the box structure 2, the receiving portions 44 of the second connector 21 are arranged at a position opposite the insertion portions 36 of the first connector 20, allowing the first connector 20 and the second connector 21 to be connected. In addition, when the insertion portions 36 are inserted into receiving portions 44, the terminals of both make contact with each other so that drive power from the power supply terminal 19 of the wire distribution board 4 is supplied to the fan motor 29.

As the bobbin-shaped members 47 of the second connector 21 are movable with respect to the mounting holes 46 of the securing pieces 48, the securing pieces 48 can also be moved relative to the protruding portions 35 which are inserted into the winding shape members 47. Therefore, the second connector 21 and the connector body 45 can move relative to each other.

Because of this, even if the positions of the insertion portions 36 of the first connector 20 and the receiving portions 44 of the second connector 21 are slightly shifted when the fan unit 5 is mounted to the box structure 2, those position errors can be absorbed by means of moving the connector body 45 of the second connector 21.

Next, the second embodiment is explained with reference to FIG. 1B.

This embodiment is characterized in that the first connector 50 is directly disposed on the wire distribution board 4.

More specifically, as shown in FIG. 1B, the wire distribution board 4 according to the second embodiment has an upper extension portion which extends upward from the upper side thereof, and the first connector 50 is mounted to the upper extension portion of the wire distribution board 4 at the location corresponding to the window portion 14 which is formed at an upper portion of the rear wall of the box structure 2.

What is claimed is:

1. A numerical control device comprising:

a box structure;

boards housed inside said box structure;

a fan unit mounted to said box structure and including an internal fan motor;

a first connector wired from a power supply terminal and secured to said box structure;

a second connector wired from the internal fan motor and secured to said fan unit at a position opposite said first connector secured to said box structure; and a top panel installed in the box structure, wherein said first connector is connectable to said second connector, said boards are arranged at one side of the top panel, while the fan unit is arranged at the other side of the top panel, and a through hole is formed in a wall of said box structure at a position above said top panel, wherein said first connector passes through the through hole from outside the box structure to inside the box structure.

2. The numerical control device according to claim 1, further comprising:

a protrusion formed in the outer surface of the wall having the through hole to mount a wire distribution board.

3. The numerical control device according to claim 1, wherein said box structure comprises a coupling portion formed in a wall of the box structure at a position above said top panel to engage said fan unit, and said fan unit comprises a protrusion to engage the coupling portion formed in the wall of the box structure.

4. The numerical control device according to claim 2, wherein the second connector comprises a receiving portion and the first connector comprises an insertion portion to couple to the receiving portion of the second connector.

5. The numerical control device as recited in claim 2, wherein the protrusion is a hook-shaped piece.

6. The numerical control device as recited in claim 2, wherein the second connector comprises an insertion portion and the first connector comprises a receiving portion to couple to the insertion portion of the second connector.

7. The numerical control device as recited in claim 3, wherein the coupling portion is a coupling hole, and the protrusion engages the coupling hole.

8. The numerical control device as recited in claim 3, wherein the coupling portion is a coupling channel, and the protrusion engages the coupling channel.

* * * * *